US 9,466,382 B2

(12) United States Patent
Avila et al.

(10) Patent No.: US 9,466,382 B2
(45) Date of Patent: Oct. 11, 2016

(54) COMPENSATION FOR SUB-BLOCK ERASE

(71) Applicant: SanDisk Technologies Inc., Plano, TX (US)

(72) Inventors: Chris Nga Yee Avila, Saratoga, CA (US); Yingda Dong, San Jose, CA (US); Man Lung Mui, Fremont, CA (US)

(73) Assignee: SanDisk Technologies LLC, Plano, TX (US)

( * ) Notice: Subject to any disclaimer, the term of this patent is extended or adjusted under 35 U.S.C. 154(b) by 888 days.

(21) Appl. No.: 13/791,286

(22) Filed: Mar. 8, 2013

(65) Prior Publication Data

US 2014/0133232 A1   May 15, 2014

Related U.S. Application Data

(60) Provisional application No. 61/726,491, filed on Nov. 14, 2012.

(51) Int. Cl.
| | |
|---|---|
| *G11C 16/04* | (2006.01) |
| *G11C 16/16* | (2006.01) |
| *G11C 16/26* | (2006.01) |
| *H01L 27/115* | (2006.01) |
| *G11C 16/10* | (2006.01) |

(52) U.S. Cl.
CPC .......... *G11C 16/16* (2013.01); *G11C 16/0483* (2013.01); *G11C 16/26* (2013.01); *G11C 16/10* (2013.01); *H01L 27/115* (2013.01)

(58) Field of Classification Search
CPC .. G11C 16/0483; G11C 16/10; H01L 27/115

USPC ............. 365/185.17, 185.29, 185.03, 185.11
See application file for complete search history.

(56) References Cited

U.S. PATENT DOCUMENTS

| | | | |
|---|---|---|---|
| 5,768,192 A | 6/1998 | Eitan | |
| 6,011,725 A | 1/2000 | Eitan | |
| 8,559,224 B2 | 10/2013 | Han et al. | |
| 2006/0140001 A1* | 6/2006 | Lee ..................... | G11C 7/1021 365/185.17 |
| 2008/0158983 A1 | 7/2008 | Mokhlesi et al. | |
| 2009/0129146 A1 | 5/2009 | Sarin et al. | |
| 2012/0096328 A1 | 4/2012 | Franceschini et al. | |
| 2012/0170365 A1 | 7/2012 | Kang et al. | |

OTHER PUBLICATIONS

Eitan et al., "NROM: A Novel Localized Trapping, 2-Bit Nonvolatile Memory Cell," IEEE Electron Device Letters, vol. 21, No. 11, Nov. 2000, pp. 543-545.
Technical Search Report, Dec. 18, 2012, 7 pages.
Office Action for U.S. Appl. No. 14/279,037 mailed Sep. 8, 2014, 11 pages.
Notice of Allowance and Fees Due for U.S. Appl. No. 14/279,037 mailed Nov. 3, 2014, 9 pages.

\* cited by examiner

*Primary Examiner* — Jason Lappas
(74) *Attorney, Agent, or Firm* — Davis Wright Tremaine LLP

(57) ABSTRACT

A non-volatile memory system that has two or more sub-blocks in a block performs a check before accessing memory cells to see if the condition of a sub-block that is not being accessed could affect the memory cells being accessed. If such a sub-block is found then parameters used to access the cells may be modified according to a predetermined scheme.

18 Claims, 4 Drawing Sheets

COMPENSATION FOR SUB-BLOCK ERASE

This application claims the benefit of Provisional Patent Application No. 61/726,491, filed on Nov. 14, 2012, which is hereby incorporated by reference in its entirety.

BACKGROUND

This application relates to the operation of re-programmable nonvolatile memory systems such as semiconductor flash memory systems, and, more specifically, to three-dimensional memory systems and to methods of operating such memory systems.

Solid-state memory capable of nonvolatile storage of charge, particularly in the form of EEPROM and flash EEPROM packaged as a small form factor card, has recently become the storage of choice in a variety of mobile and handheld devices, notably information appliances and consumer electronics products. Unlike RAM (random access memory) that is also solid-state memory, flash memory is non-volatile, and retains its stored data even after power is turned off. Also, unlike ROM (read only memory), flash memory is rewritable similar to a disk storage device. In spite of the higher cost, flash memory is increasingly being used in mass storage applications. Conventional mass storage, based on rotating magnetic medium such as hard drives and floppy disks, is unsuitable for the mobile and handheld environment. This is because disk drives tend to be bulky, are prone to mechanical failure and have high latency and high power requirements. These undesirable attributes make disk-based storage impractical in most mobile and portable applications. On the other hand, flash memory, both embedded and in the form of a removable card is ideally suited in the mobile and handheld environment because of its small size, low power consumption, high speed and high reliability features.

Flash EEPROM is similar to EEPROM (electrically erasable and programmable read-only memory) in that it is a non-volatile memory that can be erased and have new data written or "programmed" into their memory cells. Both utilize a floating (unconnected) conductive gate, in a field effect transistor structure, positioned over a channel region in a semiconductor substrate, between source and drain regions. A control gate is then provided over the floating gate. The threshold voltage characteristic of the transistor is controlled by the amount of charge that is retained on the floating gate. That is, for a given level of charge on the floating gate, there is a corresponding voltage (threshold) that must be applied to the control gate before the transistor is turned "on" to permit conduction between its source and drain regions. In particular, flash memory such as Flash EEPROM allows entire blocks of memory cells to be erased at the same time.

Nonvolatile memory devices are also manufactured from memory cells with a dielectric layer for storing charge. Instead of the conductive floating gate elements described earlier, a dielectric layer is used. Such memory devices utilizing dielectric storage element have been described by Eitan et al., "NROM: A Novel Localized Trapping, 2-Bit Nonvolatile Memory Cell," IEEE Electron Device Letters, vol. 21, no. 11, November 2000, pp. 543-545. An ONO dielectric layer extends across the channel between source and drain diffusions. The charge for one data bit is localized in the dielectric layer adjacent to the drain, and the charge for the other data bit is localized in the dielectric layer adjacent to the source. For example, U.S. Pat. Nos. 5,768,192 and 6,011,725 disclose a nonvolatile memory cell having a trapping dielectric sandwiched between two silicon dioxide layers. Multi-state data storage is implemented by separately reading the binary states of the spatially separated charge storage regions within the dielectric.

SUMMARY

According to a general aspect of the invention a memory system in which sub-block erase may be performed compensates for an erased sub-block when accessing cells of another sub-block in the same erase block. For example, where a block is made up of two sub-blocks, access to the second sub-block may use different parameters depending on whether the first sub-block has been erased or not. Access may include reading, programming, or erasing a portion of the memory array. Parameters that may be different include read voltages, programming voltages, and erasing voltages. A NAND string, such as a 3-dimensional NAND string that extends perpendicularly from a substrate surface, may contain portions of two or more different sub blocks, and the conditions of these sub-blocks (written or erased) may determine which set of parameters to use in a given access operation.

An example of a method of adaptively operating memory cells in a NAND array in which an erase block includes two or more separately erasable sub-blocks, includes: identifying a plurality of memory cells to be accessed in an operation, the plurality of memory cells located in a first sub-block of the erase block; identifying a second sub-block that is in the erase block, memory cells of the second sub-block connected in series with memory cells of the first sub-block; determining a condition of the second sub-block; and subsequently, determining parameters to be used in the operation accessing the plurality of memory cells in the first sub-block from the determined condition of the second sub-block.

The operation may be a read operation to read data from the plurality of memory cells and the parameters to be used in the operation may include a voltage to be applied to a word line during the read operation. The operation may be a read operation to read data from the plurality of memory cells and the parameters to be used in the operation may include a read voltage to be applied to a selected word line during the read operation and a read-pass voltage to be applied to unselected word lines during the read operation. The condition of the second sub-block may be either a written condition or an erased condition. The second sub-block may be considered to be in a written condition if more than a predetermined number of memory cells in the second sub-block are written. The operation may be a write operation to write data to the plurality of memory cells and the parameters to be used in the write operation may include a voltage used for verification that a memory cell has reached a target condition. The operation may be a write operation to write data to the plurality of memory cells and the parameters to be used in the write operation may include an amplitude of a voltage pulse applied to a word line. The operation may be an erase operation to erase all memory cells of the first sub-block and the parameters to be used in the erase operation may include an erase voltage to be applied to all word lines of the first sub-block during the erase operation. The operation may be an erase operation to erase all memory cells of the first sub-block and the parameters to be used in the erase operation may include a non-erase voltage to be applied to all word lines of the second sub-block during the erase operation. The NAND array may be a 3-dimensional NAND array in which NAND strings extend perpendicular to a substrate surface. The NAND strings may be U-shaped with each side extending perpendicular to the substrate surface. Each side of the NAND strings may be in a different sub-block.

An example of a NAND array includes: a plurality of NAND strings of memory cells, each of the plurality of NAND strings including first cells in a first separately-erasable sub-block and second cells in a second separately-erasable sub-block that are connected together in series; and peripheral circuits that are configured to access the first cells in the first separately-erasable sub-block using a first set of access parameters when the second separately-erasable sub-block is erased and configured to access the first cells in the first separately-erasable sub-block using a second set of access parameters when the second separately-erasable sub-block is written.

The NAND array may further include a determination circuit to determine whether the second separately-erasable sub-block is erased or written. The NAND array may further include a parameter storage unit that stores the first set of access parameters and the second set of access parameters. The plurality of NAND strings may extend perpendicular to a substrate surface. The individual NAND strings may be U-shaped with each side extending perpendicular to the substrate surface. A first side of a U-shaped string may contain first cells in the first separately-erasable sub-block and a second side of the U-shaped string may contain second cells in the second separately-erasable sub-block.

Various aspects, advantages, features and embodiments of the present invention are included in the following description of exemplary examples thereof, which description should be taken in conjunction with the accompanying drawings. All patents, patent applications, articles, other publications, documents and things referenced herein are hereby incorporated herein by this reference in their entirety for all purposes. To the extent of any inconsistency or conflict in the definition or use of terms between any of the incorporated publications, documents or things and the present application, those of the present application shall prevail.

DETAILED DESCRIPTION

Figure 1:
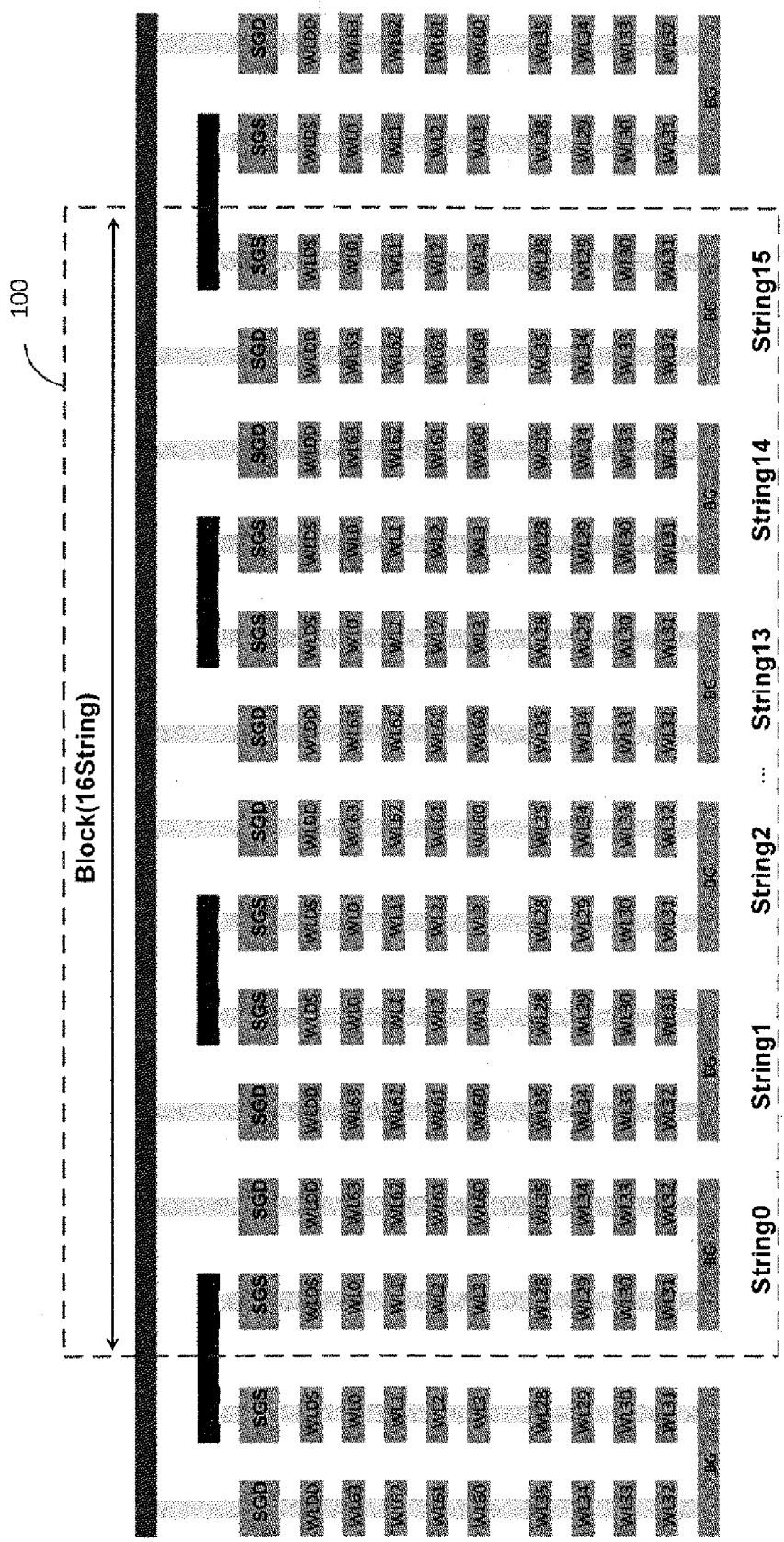
FIG. 1 shows an example of a 3-D memory with U-shaped NAND strings.

FIG. 1 illustrates a cross-section of a three dimensional memory structure (3-D memory). In contrast to two dimensional (2-D) structures, the structure of FIG. 1 shows multiple layers of memory cells stacked in the vertical direction. Examples of such memory structures and their operation may be found in a U.S. Patent Application entitled, "SELECTIVE WORD LINE ERASE IN 3D NON-VOLATILE MEMORY" by Yingda Dong, et al., and in Provisional Patent Application No. 61/726,491, both of which are incorporated by reference in their entirety. FIG. 1 is simply one example of such a memory structure and aspects of the present invention may also be implemented using various other structures, for example, the structures disclosed in the above applications.

FIG. 1 shows how a block 100 is formed that includes 16 strings (String 0-String 15, not all of which are shown). The block further includes similar strings that are not shown in this cross section because they lie in a different plane (e.g. behind the plane shown in FIG. 1). Such large blocks (compared with typical 2-D blocks) have certain drawbacks. In some cases it is desirable to operate with smaller units of erase than such large blocks. In order to achieve this, several arrangements allow a portion of a block, a "sub-block," to be erased while maintaining data in other sub-blocks in the same block. This is different from the common arrangement in which a block forms the smallest unit of erase.

Figure 2:
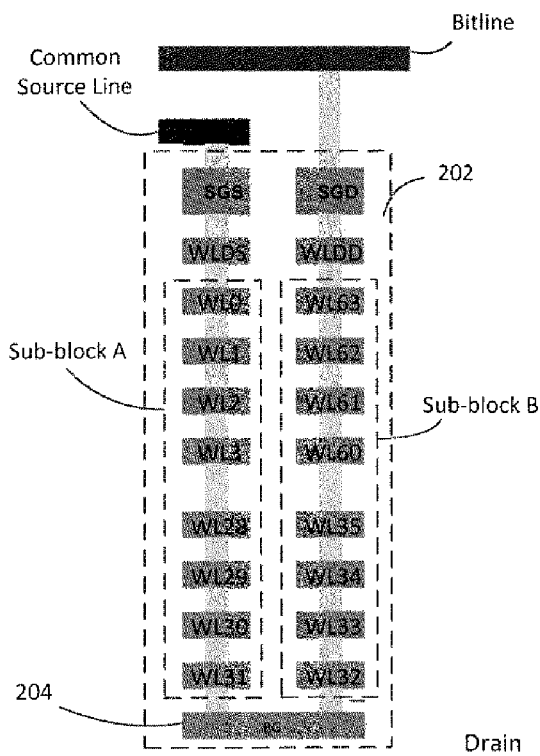
FIG. 2 shows a U-shaped NAND string with each side in a different sub-block.

FIG. 2 shows an example of a single NAND string 202 of FIG. 1 that is arranged in a U-shape with memory cells formed on either side of the U. Memory cells are formed where word lines (WL0-WL63) intersect vertical columns on either side. In this example, each side of the string is in a different sub-block, although in other examples sub-blocks may be formed of just a portion of one side, or may be formed by portions of both sides. Sub-block A includes the 32 memory cells on the source side (corresponding to WL0-WL31), while sub-block B includes the 32 memory cells on the drain side (corresponding to WL32-WL63). The two sides of the string 202 are connected by a controllable connection 204 referred to as a "back gate" or BG. In other arrangements, cells in a string that are in different sub-blocks may not be separated by such a gate. Cells of different sub-blocks may be separated by dummy cells or in some other way in other arrangements.

Figure 3A:
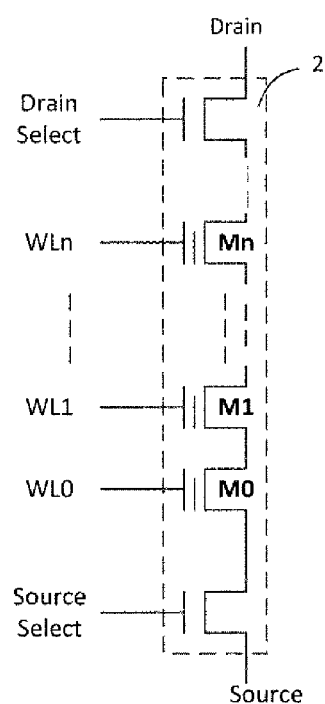
FIG. 3A is a schematic of a NAND string.

FIG. 3A is a schematic illustration of the memory cells of NAND string 202 FIG. 2 (this illustration shows cells as a straight line for simplicity, even though the physical arrangement is a U-shape). Source select and drain select gates are provided for selective connection of the source (to common source line) and drain (to bitline) respectively. A charge storage memory cell M0 is formed where WL0 couples to the conductive column; M1 is formed where WL1 couples to the conductive column, etc. FIG. 3A shows generic memory cell Mn formed where WLn couples to the conductive column. Dummy word lines and the back gate are omitted for simplicity but it will be understood that such additional devices may be present in a NAND string.

Figure 3B:
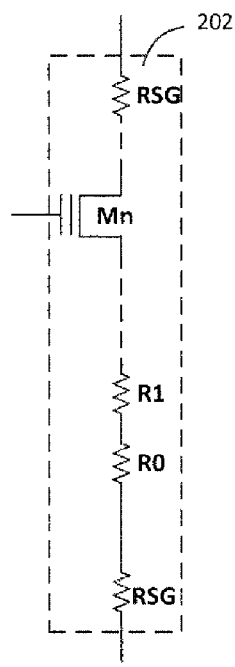
FIG. 3B is a schematic of reading a cell in a NAND string.

FIG. 3B is another schematic that illustrates an operation to access memory cell Mn in NAND string 202. While accessing memory cell Mn, other memory cells in the string are turned on by applying a predetermined voltage to their gates, the predetermined voltage exceeding their threshold voltages. Select gates at either end of the string are also turned on (as are any dummy cells formed by dummy word lines). Memory cells may be considered to provide a fixed resistance to current flow (indicated by R0, R1) through the column when turned on in this way. Certain assumptions have generally been made with respect to such fixed resistances. However, the resistance of a programmed memory cell (with charge in a charge storage element) is not identical to the resistance of an erased memory cell (with no charge in a charge storage element) for a given bias to the control gate of the memory cell. In some cases such differences may have a significant effect.

When programming memory cells in a string, programming generally begins from one end of the string (source end) and progresses sequentially. In FIG. 2 this sequence of programming progresses in the order of the word line numbering (i.e. WL0 first, then WL1, then WL2, etc). Thus, when programming cell Mn, it may be assumed that cells M0 to Mn-1 are programmed and are not all in the erased state. They may be assumed to be in different states depending on the individual bit or bits they contain (such states may be randomized by a randomization process, and would be expected to be reasonably random even without a randomization operation). However, where sub-block erase is used such assumptions regarding these memory cells may not be valid. In particular, even though programming proceeds sequentially, memory cells earlier in such a sequence may be erased as a result of sub-block erase.

Where memory cell Mn is in sub-block B of FIG. 2, for example, the values of R0, R1, etc. depend on whether a sub-block erase has been performed on sub-block A. If sub-block A has been erased, then all cells M0-M31 are in the erased state, if sub-block A has not been erased then cells M0-M31 are in various states. Because memory cells M0-M31 are connected in series with Mn, the series resistance of these cells is important to correctly program and verify memory cell Mn. For example, verification includes applying a set of voltages to the memory cells to determine whether Mn is conductive under particular conditions. Different resistance in series with Mn changes the apparent resistance of Mn when reading. Correcting for changes in the resistance of memory cells M0-Mn when sub-block erase is performed in sub-block A can provide improved programming of memory cell Mn in sub-block B.

Similarly, when reading cell Mn, because Mn is programmed it may be assumed that cells M0 to Mn-1 have also been programmed and that their combined resistance reflects some average quantity of charge stored per cell. In the case where a sub-block erase has been performed, this is not a valid assumption (i.e. the average charge stored per cell may be zero as a result of erase).

In general, memory cells are accessed using a set of parameters that may be generic to a large number of memory cells (e.g. all memory cells in a particular array, or die) or may be more specific (e.g. to a plane, block, page, or other unit). Such parameters may be static throughout the lifecycle of a device or may be updated over time (e.g. to reflect changing device characteristics resulting from wear). Where sub-block erase of a particular sub-block may affect access to certain cells in other sub-blocks, it is desirable to use a modified sets of parameters to account for this change (e.g. apply a set of predetermined offsets to parameters depending on whether a sub-block erase has been performed or not). A set of default parameters may be used where no sub-block erase has been performed and a modified set of parameters may be used where a sub-block erase has been performed. Parameters for access operations, including read, write, and/or erase may be modified in this way. Parameters may be modified more than once from default parameters depending on how many sub-block erasures affect the access operation (e.g. where cells of a string are in four different sub-blocks, a default set of parameters may be subject to a first modification where one sub-block has been erased, subject to a second modification where two sub-blocks have been erased, and subject to a third modification where three sub-blocks have been erased).

Figure 4:
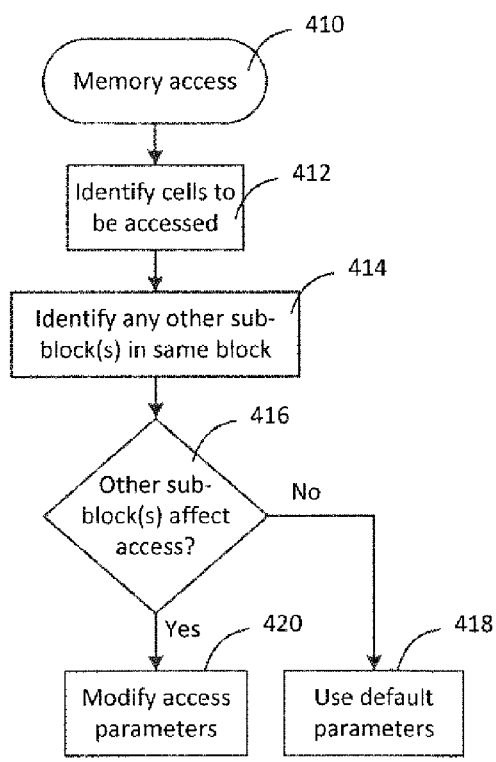
FIG. 4 shows an example of an access operation in a NAND memory with sub-block Erase.

FIG. 4 illustrates a general scheme for memory access 410 in a memory using sub-block erase. The cells to be accessed are first identified 412 along with a sub-block in which they are located. Then, any other sub-block, or sub-blocks, in the same block as the identified cells are identified 414. A determination is made as to whether the condition of the other sub-block(s) will affect the access operation 416. This may be based on experimental data showing which sub-blocks affect access to different cells, or may be based on modeling. If the condition of the other sub-block(s) is not expected to affect the access (e.g. because there has been no sub-block erase, or experimental data indicates no effect) then default parameters are used 418. If the condition of the other sub-block(s) is expected to affect access then parameters for the access operation may be modified according to a modification scheme 420. A modification scheme may include various modifications to different sets of access parameters depending on the sub-blocks that have been erased. Such a scheme may be stored in a table or otherwise.

Figure 5:
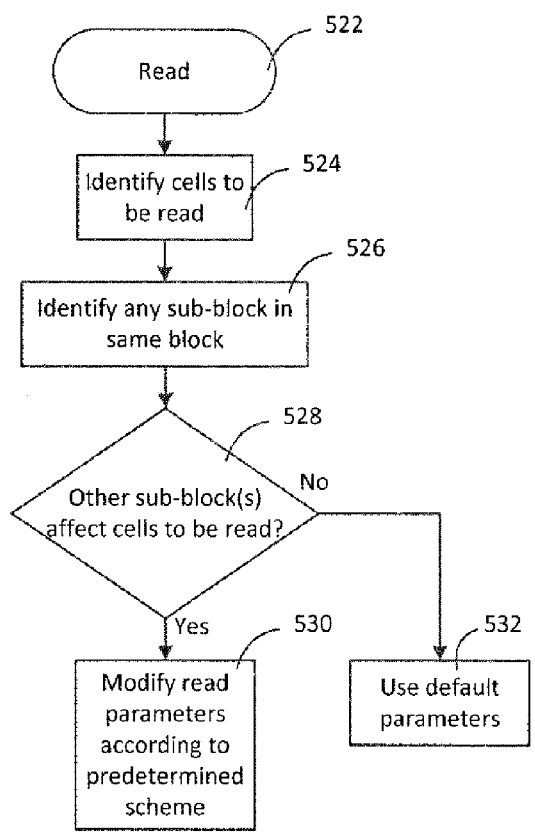
FIG. 5 shows an example of a read operation in a NAND memory with sub-block erase.

FIG. 5 illustrates a reading scheme 522 for a memory using sub-block erase. The cells to be read are identified 524 along with a sub-block in which they are located. Then any other sub-block, or sub-blocks, in the same block as the cells to be read are identified 526. A determination is made as to whether the condition of the other sub-block(s) will affect the read operation 528. For example, an erased sub-block on the source side of a cell to be read may affect the read operation as described above, while an erased sub-block on the drain side of the cell may not affect the read (default conditions may not be based on any particular expectation regarding cells on drain side). If the condition of the other sub-block(s) will affect the read operation then the read parameters are modified according to the expected effect of the condition according to a predetermined scheme 530. For example, the voltage applied to a cell being read may be modified by a predetermined offset. This may be applied to some, or all, such voltages in a multi-level cell (MLC) read scheme. Voltages applied to unselected cells may be modified also, or as an alternative. If the condition of the other sub-block(s) is not expected to affect the read then a set of default read parameters may be used 532.

Figures 6, 7:
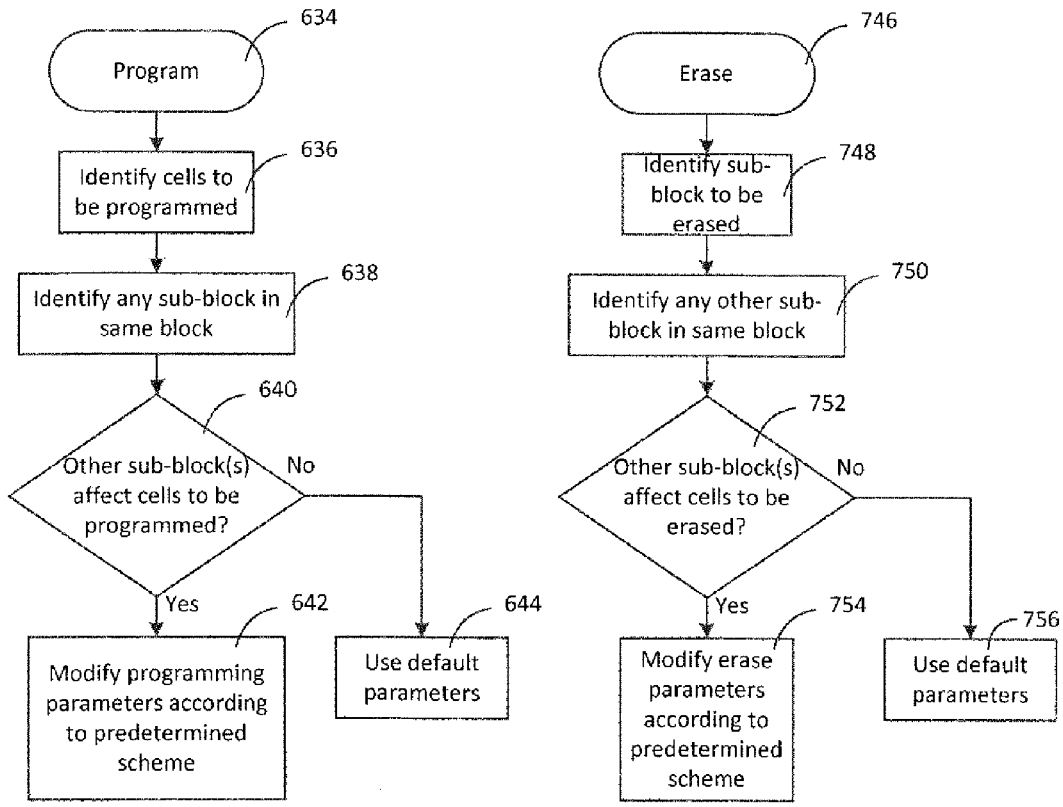
FIG. 6 shows an example of a program operation in a NAND memory with sub-block erase.
FIG. 7 shows an example of an erase operation in a NAND memory with sub-block erase.

FIG. 6 illustrates a programming (writing) scheme 634 for a memory using sub-block erase. The cells to be programmed are identified 636 along with a sub-block in which they are located. Then any other sub-block, or sub-blocks, in the same block as the cells to be programmed are identified 638. A determination is made as to whether the condition of the other sub-block(s) will affect the programming operation 640. If the condition of the other sub-block(s) will affect the programming operation then the programming parameters are modified according to the expected effect of the condition according to a predetermined scheme 642. For example, the amplitude of a voltage pulse applied to a cell being programmed may be modified by a predetermined offset, or the duration of such a pulse may be modified. This may be applied to some, or all, such voltages. Voltages applied to unselected cells may be modified also, or as an alternative. If the condition of the other sub-block(s) is not expected to affect the programming operation then a set of default programming parameters may be used 644.

FIG. 7 illustrates an erase scheme 746 for a memory using sub-block erase. A sub-block to be erased is identified 748. Then any other sub-block, or sub-blocks, in the same block are identified 750. A determination is made as to whether the condition of the other sub-block(s) will affect the erase operation 752. If the condition of the other sub-block(s) will affect the erase operation then the erase parameters are modified according to the expected effect of the condition according to a predetermined scheme 754. For example, the erase voltage applied to a selected cell may be modified, the time the erase voltage is applied may be modified, and/or voltage(s) applied to unselected cells during erase may be modified. If the condition of the other sub-block(s) is not expected to affect the erase operation then a set of default erase parameters may be used 756.

One consequence of performing sub-block erase is that different sub-blocks may experience different numbers of write-erase cycles (instead of having a common number of write-erase cycles). Thus, there is a possibility of heavier wear on some sub-blocks than on other sub-blocks in the same block. For example, where, as described above, programming proceeds sequentially from source to drain, a sub-block closer to the source may be written and erased more frequently than a sub-block that is farther away from the source. Such uneven wear may cause a block to become defective prematurely (e.g. one sub-block wears out causing the block to be defective while other sub-blocks are still functioning well).

Figures 8, 9:
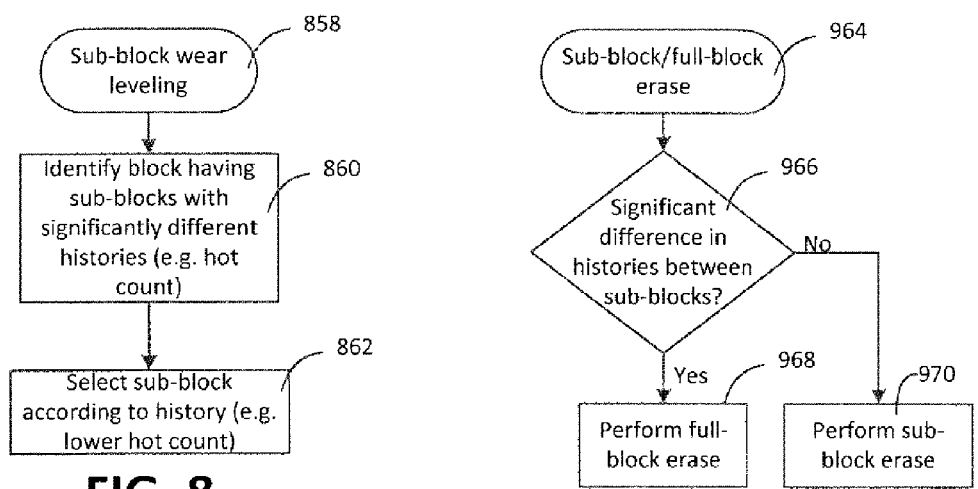
FIG. 8 shows an example of a wear-leveling in a NAND memory with sub-block erase.
FIG. 9 shows an example of a scheme for managing erase in a NAND memory with sub-block erase.

FIG. 8 shows a scheme for wear-leveling between sub-blocks 858 in which individual histories are maintained for each sub-block. Blocks containing sub-blocks with significantly different histories are identified 860. Histories may include the number of write-erase cycles or other factors that indicate uneven wear. A single number may reflect the total number of erase operations performed on a sub-block (full-block erases plus sub-block erases) or separate counts may be maintained for the number of full-block erase operations and the number of sub-block erase operations (as these operations may have different effects). A difference may be considered significant if it exceeds a threshold number. When such a block is identified appropriate corrective measures may be taken. For example, a particular sub-block may be selected for storing data based on its history 862. Thus, a scheme for assigning physical locations to store data may be modified to prioritize sub-blocks with low wear, or to avoid sub-blocks with high wear. In some cases, this may leave unwritten sub-blocks in some blocks for some period of time. This may be an acceptable price to pay under some conditions (e.g. where memory not close to full).

FIG. 9 illustrates a scheme 964 for keeping the number of write-erase cycles of different sub-blocks in a block within a predetermined range with respect to each other. A determination is made as to whether a significant difference exists between histories of different sub-blocks 966. For example, whether a difference in write-erase cycle count exceeds a threshold number. When a significant difference is found, the block may be configured for full-block erase only (i.e. disabling sub-block erase) 986. This prevents the difference in write-erase cycle count from increasing further by ensuring that if one sub-block is erased then all other sub-blocks in the same block are also erased. If no significant difference is found then sub-block erasing may be allowed 970.

CONCLUSION

The foregoing detailed description has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

It is claimed:

1. A method of adaptively operating memory cells in a NAND array in which an erase block includes two or more separately erasable sub-blocks, comprising:
   identifying a plurality of memory cells to be accessed in an operation, the plurality of memory cells located in a first sub-block of the erase block;
   identifying a second sub-block that is in the erase block, memory cells of the second sub-block connected in series with memory cells of the first sub-block;
   determining a condition of the second sub-block; and
   subsequently, determining parameters to be used in the operation accessing the plurality of memory cells in the first sub-block from the determined condition of the second sub-block.

2. The method of claim 1 wherein the operation is a read operation to read data from the plurality of memory cells and the parameters to be used in the operation include a voltage to be applied to a word line during the read operation.

3. The method of claim 1 wherein the operation is a read operation to read data from the plurality of memory cells and the parameters to be used in the operation include a read voltage to be applied to a selected word line during the read operation and a read-pass voltage to be applied to unselected word lines during the read operation.

4. The method of claim 1 wherein the condition of the second sub-block is either a written condition or an erased condition.

5. The method of claim 4 wherein the second sub-block is considered to be in a written condition if more than a predetermined number of memory cells in the second sub-block are written.

6. The method of claim 1 wherein the operation is a write operation to write data to the plurality of memory cells and the parameters to be used in the write operation include a voltage used for verification that a memory cell has reached a target condition.

7. The method of claim 1 wherein the operation is a write operation to write data to the plurality of memory cells and the parameters to be used in the write operation include an amplitude of a voltage pulse applied to a word line.

8. The method of claim 1 wherein the operation is an erase operation to erase all memory cells of the first sub-block and the parameters to be used in the erase operation include an erase voltage to be applied to all word lines of the first sub-block during the erase operation.

9. The method of claim 8 wherein the operation is an erase operation to erase all memory cells of the first sub-block and the parameters to be used in the erase operation include a non-erase voltage to be applied to all word lines of the second sub-block during the erase operation.

10. The method of claim 1 wherein the NAND array is a 3-dimensional NAND array in which NAND strings extend perpendicular to a substrate surface.

11. The method of claim 10 wherein the NAND strings are U-shaped with each side extending perpendicular to the substrate surface.

12. The method of claim 11 wherein each side of the NAND strings is in a different sub-block.

13. A NAND array comprising:
   a plurality of NAND strings of memory cells, each of the plurality of NAND strings including first cells in a first separately-erasable sub-block and second cells in a second separately-erasable sub-block that are connected together in series; and peripheral circuits that are configured to access the first cells in the first separately-erasable sub-block using a first set of access parameters when the second separately-erasable sub-block is erased and configured to access the first cells in the first separately-erasable sub-block using a second set of access parameters when the second separately-erasable sub-block is written.

14. The NAND array of claim 13 further comprising a determination circuit to determine whether the second separately-erasable sub-block is erased or written.

15. The NAND array of claim 14 further comprising a parameter storage unit that stores the first set of access parameters and the second set of access parameters.

16. The NAND array of claim 13 wherein the plurality of NAND strings extend perpendicular to a substrate surface.

17. The NAND array of claim 16 wherein individual NAND strings are U-shaped with each side extending perpendicular to the substrate surface.

18. The NAND array of claim 17 wherein a first side of a U-shaped string contains first cells in the first separately-erasable sub-block and a second side of the U-shaped string contains second cells in the second separately-erasable sub-block.

* * * * *